(12) United States Patent
Go

(10) Patent No.: US 6,377,742 B1
(45) Date of Patent: *Apr. 23, 2002

(54) LEAD FRAME, OPTICAL MODULE, AND A METHOD OF OPTICAL MODULE

(75) Inventor: Hisao Go, Kanawana (JP)

(73) Assignee: Sumitomo Electric Industries, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/267,617

(22) Filed: Mar. 15, 1999

(30) Foreign Application Priority Data

Mar. 16, 1998 (JP) .......................... 10-065610

(51) Int. Cl.[7] ................................. G02B 6/00
(52) U.S. Cl. ..................... 385/134; 385/88; 385/92; 257/666
(58) Field of Search .............. 385/88, 89, 90, 385/91, 92, 93, 94, 31, 32, 134, 137; 257/432, 433, 459, 666

(56) References Cited

U.S. PATENT DOCUMENTS 5,361,318 A * 11/1984 Go et al. ...................... 385/89
4,810,557 A    3/1989 Blonder
5,617,495 A    4/1997 Funabashi et al. ............. 385/88
5,793,914 A    8/1998 Sasaki ........................ 385/88

FOREIGN PATENT DOCUMENTS

| JP | 57-76509   | 5/1982 |
| JP | 2-7010     | 1/1990 |
| JP | 9-61674    | 3/1997 |
| JP | 9-152527   | 6/1997 |
| JP | 10-200155  | 7/1998 |

* cited by examiner

Primary Examiner—Thong Nguyen
Assistant Examiner—Euncha Cherry
(74) Attorney, Agent, or Firm—McDermott, Will & Emery

(57) ABSTRACT

Provided are a lead frame, an optical module, and a method of making the optical module. These can reduce the force applied to a ferrule from an encapsulating die even if the alignment accuracy required in the step of bonding an optical module principal portion mounted with the ferrule onto the lead frame is relaxed. The lead frame has an island portion for mounting the optical module principal portion such that the ferrule is aligned with a predetermined direction; and an island support portion, included within the plane including the lead frame, allowing the island to be displaced in a direction intersecting the predetermined direction.

18 Claims, 17 Drawing Sheets

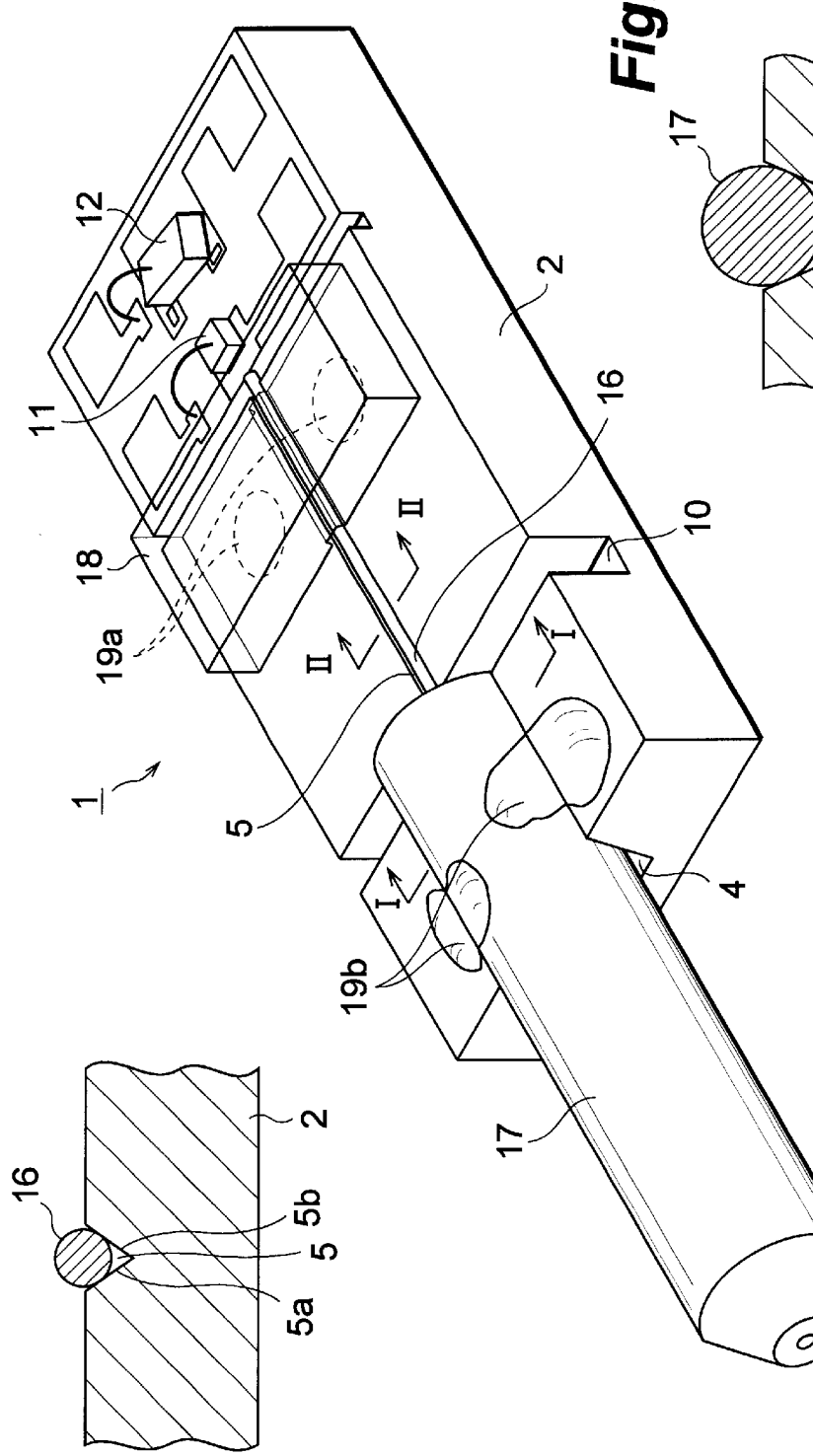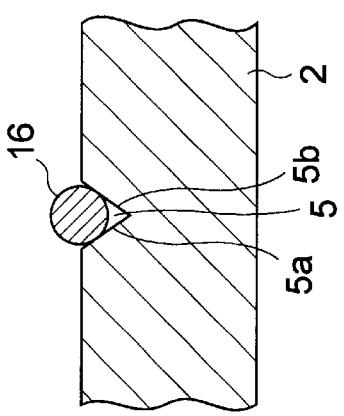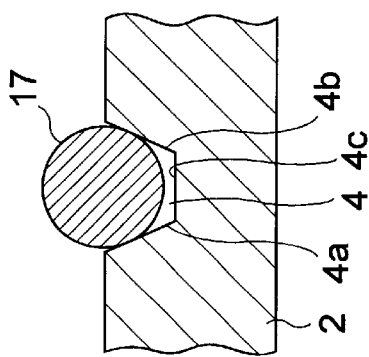

LEAD FRAME, OPTICAL MODULE, AND A METHOD OF OPTICAL MODULE

BACKGROUND OF THE INVENTION

1. Field of the Invention

The present invention relates to a lead frame applicable to a resin-encapsulated optical module, an optical module employing this lead module, and a method of making the optical module.

2. Related Background Art

Researches and developments are being made in optical modules in which an optical fiber, a ferrule, and a semiconductor optical device are mounted on a substrate, bonded onto a lead frame, and then resin-encapsulated by transfer molding. There have been no reports in conferences or the like concerning a mass production method in which a highly reliable optical module can be made.

SUMMARY OF THE INVENTION

Such an optical module comprises an optical fiber, a ferrule, a semiconductor laser diode, a substrate, and a resin body. The substrate is formed with an optical fiber support groove for supporting the optical fiber, and a ferrule support groove for supporting the ferrule. On the substrate, the optical fiber is provided in the optical fiber support groove, the ferrule is provided in the ferrule support groove, and the semiconductor laser diode is provided so as to be optically coupled to the optical fiber. After this substrate is bonded on the lead frame, wire bondings are made. After the resulting assembly is subsequently resin-encapsulated, the lead frame is cut, and the leads are bent. As a result, the finished optical module is provided.

FIG. 1 is a plan view of a lead frame that can be applied to such an optical module. The lead frame 90 comprises an island 93 and support portions 94. The above-mentioned substrate is mounted on the island 93. Each support portion 94 connects the island 93 to either a frame 91 or a tie bar 92, thereby supporting the island 93. The support portions 94 extend from three sides of the island 93 in the respective directions perpendicular to their corresponding sides, thereby reaching either the frame 91 or tie bars 92.

In a method of making the optical module, an optical module principal portion mounted with the ferrule is bonded to the island. For resin encapsulating the optical module principal portion and the lead frame, the lead frame mounted with the optical module principal portion is placed in an encapsulating die so as to be resin-encapsulated.

Having studied this optical module, the inventor has found the following points.

Since the island is supported by the support portions extending along three respective directions, the island does not have a sufficient flexibility with respect to the outer frame of the lead frame. When the lead frame is placed in the encapsulating die, care must be taken so that no force is applied from the encapsulating die to the ferrule mounted on the optical module principal portion.: It is necessary that the lead frame is placed in the encapsulating die after the optical module principal portion is correctly aligned with the lead frame and then bonded to it. Otherwise, it is necessary that the optical module principal portion is correctly aligned with the lead frame on the encapsulating die. This procedure needs much time for aligning the optical module principal portion.

It is an object of the present invention to provide a lead frame which can reduce the force applied to the ferrule from an encapsulating die, an optical module made with this lead frame, and a method of making this optical module.

The lead frame in accordance with the present invention is utilized for mounting an optical module principal portion. The optical module principal portion includes an optical module substrate. Placed on the substrates are an optical fiber, a ferrule, and a semiconductor optical device optically coupled to the optical fiber. The lead frame comprises an island portion, a frame portion, and an island support portion. The island portion is provided so as to mount the optical module principal portion such that the ferrule aligns with a predetermined axis. The frame portion is provided so as to support the island portion. The island support portion is provided so as to connect the island portion and the frame portion to each other, and has a plurality of bent portions. The island support portion extends from the island portion and bends at a plurality of positions, so as to reach the frame portion. As a consequence, when the optical module principal portion is resin-encapsulated using an encapsulating die, the misalignment between the ferrule mounted on the substrate and the encapsulating die can be reduced by the island support portion.

The lead frame in accordance with the present invention can further comprise a substrate support portion provided so as to support the optical module principal portion mounted on the island portion. The substrate support portion is separated from the island portion. The island portion has a notch, whereas the end of the substrate support portion is positioned within the notch. Also, the lead frame in accordance with the present invention can comprise a pair of substrate support portions. The pair of substrate support portions can be arranged such that the predetermined axis is provided between the pair of substrate support portions.

Various kinds of arrangements can be applied to the island support portion of the lead frame in accordance with the present invention as follows. The island support portion can comprise a first part extending from the island portion in a direction intersecting the predetermined axis, a second part extending from the first part along the predetermined axis, and a third part extending from the second part in a direction intersecting the predetermined axis. Alternatively, the island support portion can comprise a fourth part extending from the island portion along the predetermined axis, a fifth part extending from the fourth part in a direction intersecting the predetermined axis, and a sixth part extending from the fifth part along the predetermined axis. The island support portion can include a part thinner than the island portion.

BRIEF DESCRIPTION OF THE DRAWINGS

FIG. 6 shows an optical module principal portion,

FIG. 6B shows an optical fiber secured to an optical fiber support groove, and

FIG. 6C shows a ferrule secured to a ferrule support groove;

DESCRIPTION OF THE PREFERRED EMBODIMENTS

Embodiments of the present invention will be explained with reference to the accompanying drawings. Parts identical or similar to each other will be referred to with the identical numerals or letters if possible, without repeating their overlapping descriptions.

Figure 1:
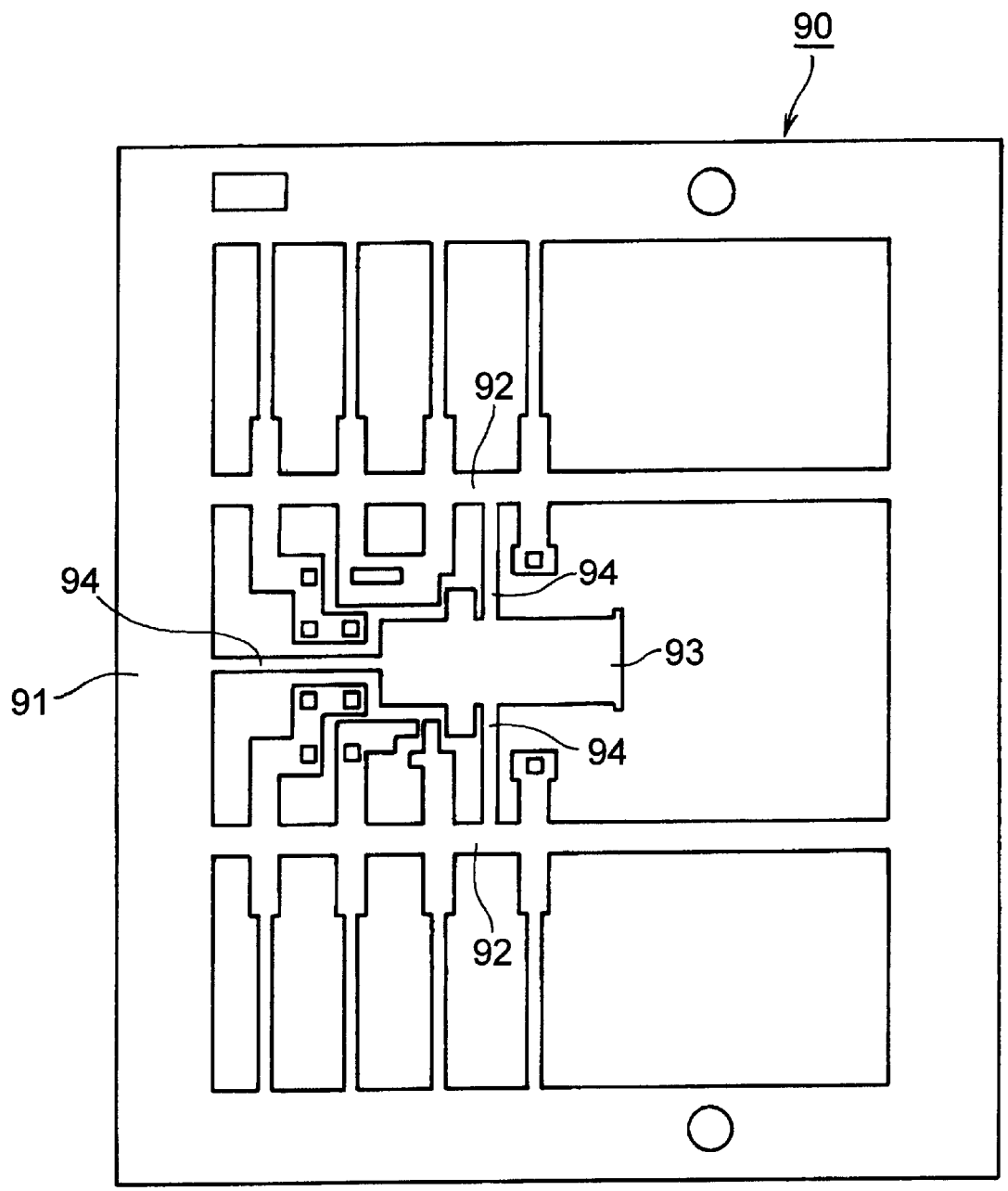
FIG. 1 is a plan view of a lead frame.
Figure 2:
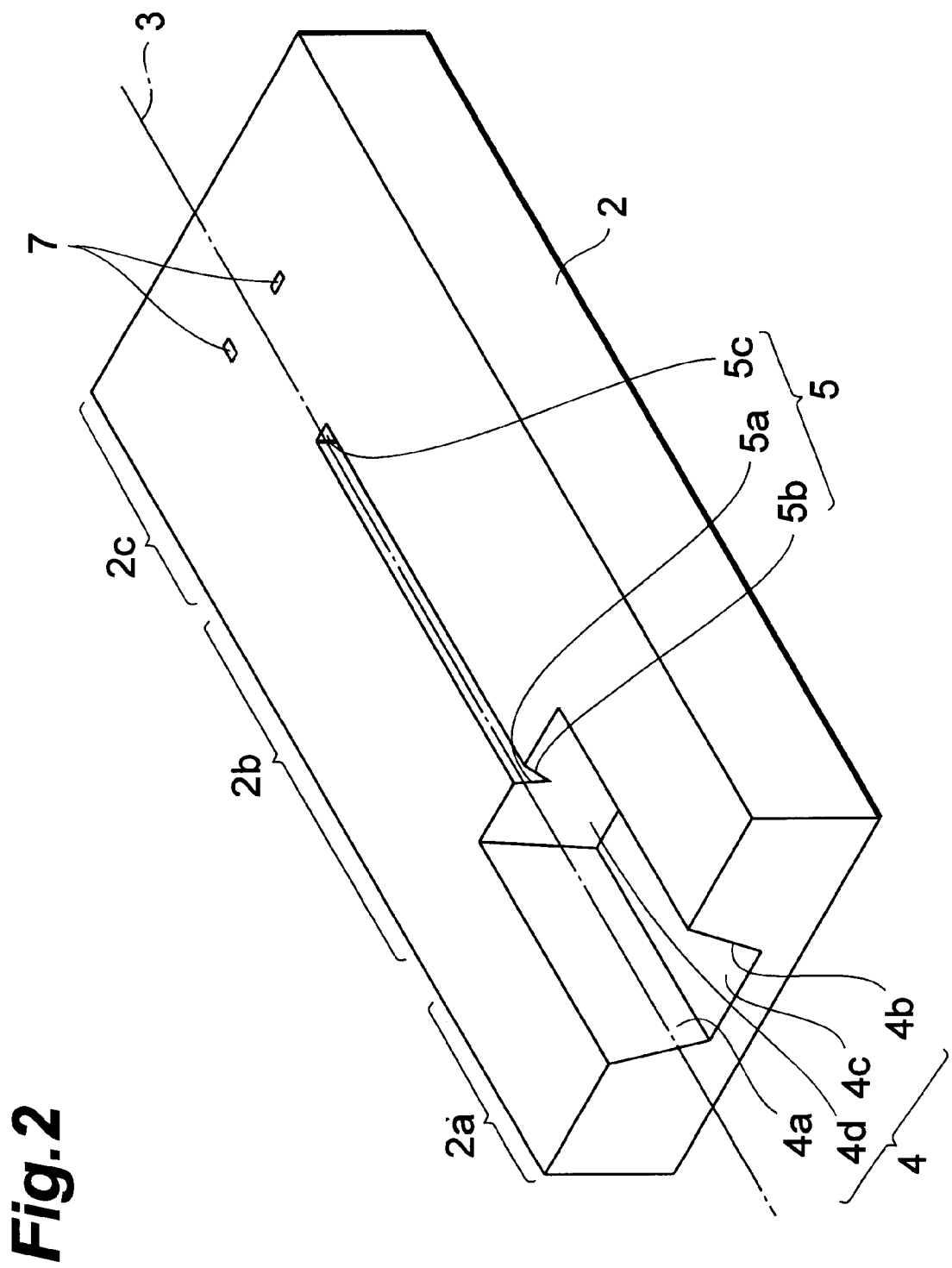
FIG. 2 shows an optical module substrate formed with grooves.

FIG. 2 is a view showing an optical module substrate. The substrate 2 comprises a first region 2a, a, second region 2b, and a third region 2c along a predetermined axis 3.

The first region 2a is provided with a ferrule support groove 4 for supporting a ferrule. The ferrule support groove 4 has two side faces 4a, 4b for supporting the ferrule and a bottom face 4c held between these two side faces. This groove has a trapezoidal cross section. The second region 2b is provided with an optical fiber support groove 5 for supporting an optical fiber. In the optical module substrate 2, the optical fiber support groove 5 and the ferrule support groove 4 are formed on the same substrate 2.

Figure 3:
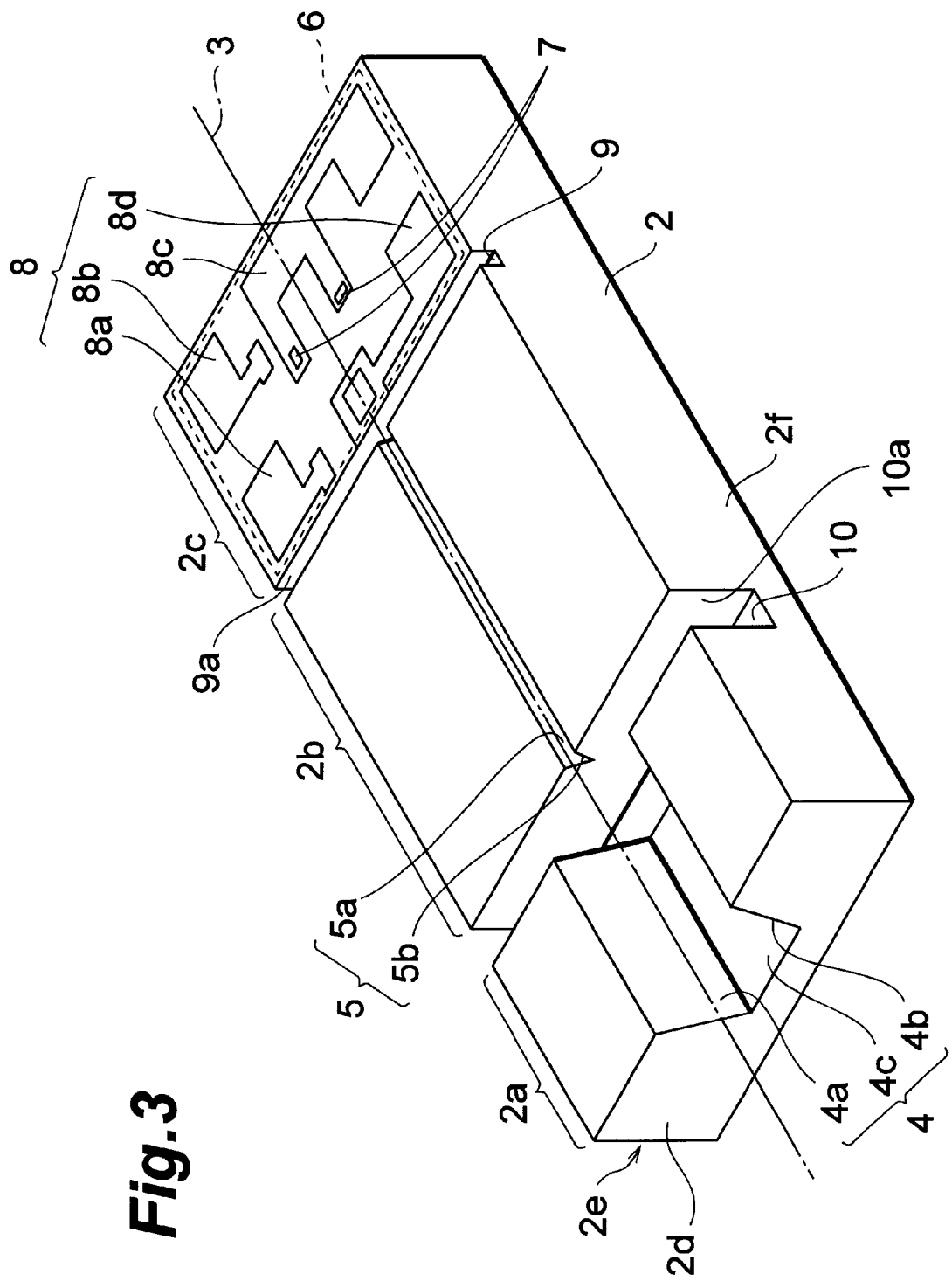
FIG. 3 shows the optical module substrate.

Referring to FIG. 3, the substrate 2 is formed with a positioning groove 9 and a connecting groove 10.

The substrate 2 has the positioning groove 9 provided so as to separate the second region 2b and the third region 2c from each other and be able to position the optical fiber. The positioning groove 9 is disposed at one end of the optical fiber support groove 5 and intersects the optical fiber support groove 5 at a predetermined angle, e.g., 90°.

The substrate 2 has the connecting groove 10 disposed so as to separate the first region 2a and the second region 2b from each other. The connecting groove 10 is disposed between the optical fiber support groove 4 and the ferrule support groove 5. The connecting groove 10 intersects the optical fiber support groove 4 and the ferrule support groove 5 at an angle of 90°, for example.

The third region 2c has an optical device mount portion 6. FIG. 2 shows the substrate 2 suitable for optically connecting a semiconductor light-emitting device (11 in FIG. 4) to the optical fiber. A semiconductor light-emitting device such as semiconductor laser is placed at the optical device mount portion 6. For monitoring the semiconductor laser, a monitor light-receiving device (12 in FIG. 4) such as photodiode can be provided. The optical device mount portion 6 has electrodes 8a, 8b, 8c, 8d for the optical device.

The substrate 2 is also referred to as silicon bench when it is formed of a silicon substrate.

Figure 4:
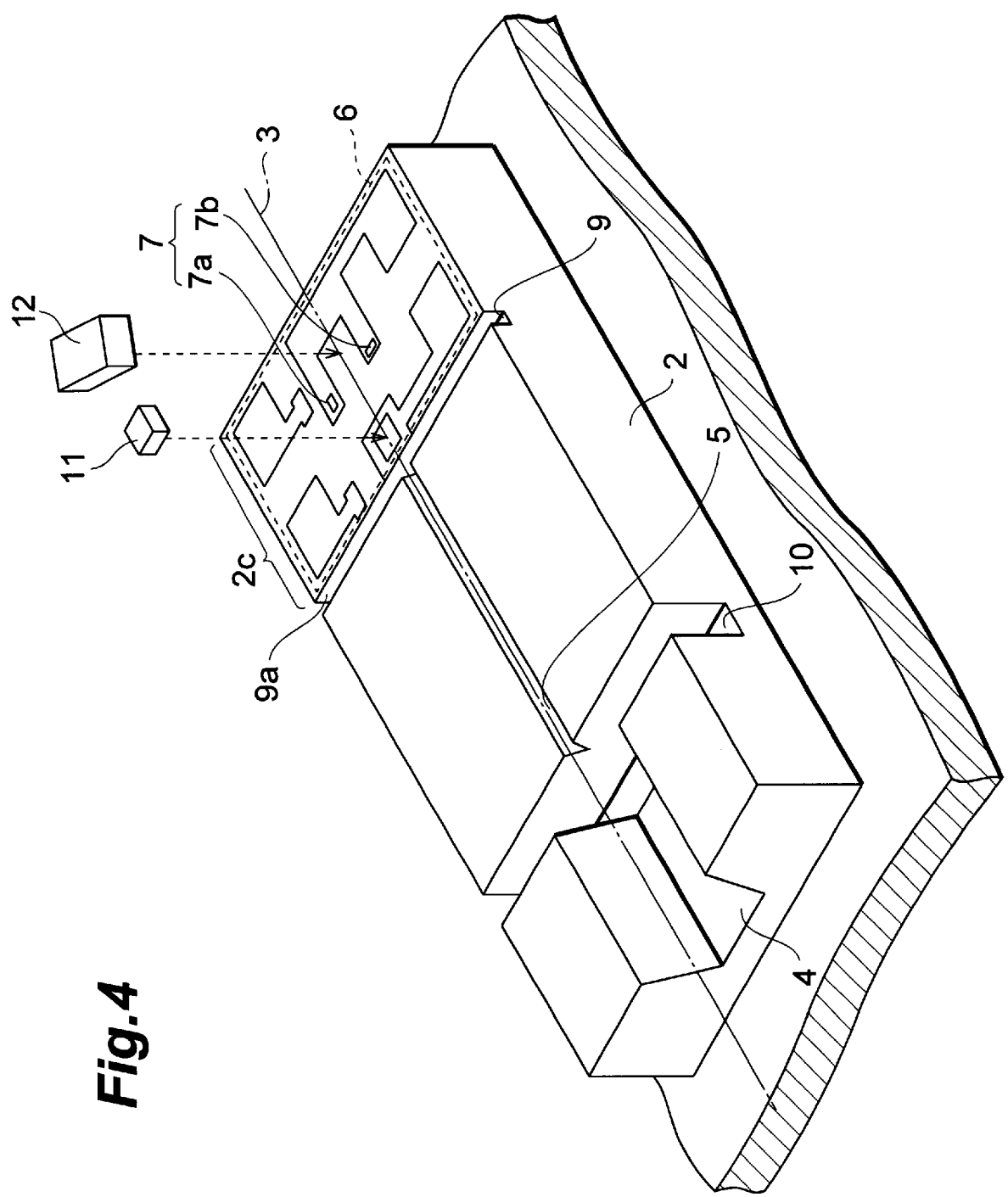
FIG. 4 shows the substrate during a step of mounting an optical device thereon.

FIG. 4 is a view showing a step of mounting a semiconductor optical device onto the substrate 2. The optical device is placed at the optical device mount portion 6 of the substrate 2. This optical device can be optically coupled to the optical fiber. The following explanation will relate to a semiconductor laser (LD) 11 and a monitor photodiode (PD) 12 mounted on the substrate as the semiconductor light-emitting device and semiconductor light-receiving device, respectively.

The LD 11 is die-bonded to the optical device mount portion 6 of the substrate 2. The die-bonding is carried out after markers on the LD and the substrate 2 are aligned with each other by use of image recognition. For achieving sufficient optical coupling to the optical fiber (single-mode optical fiber: SMF) disposed in the optical fiber support groove 4, a positioning tolerance of 2 $\mu$m is required.

Subsequently, the PD 12 is die-bonded on the optical device mount portion 6 of the substrate 2. The die bonding is carried after a marker on the PD and markers 7a, 7b on the substrate 2 are aligned with each other by use of image recognition. A positioning tolerance of about 10 $\mu$m is required for this step.

Figure 5:
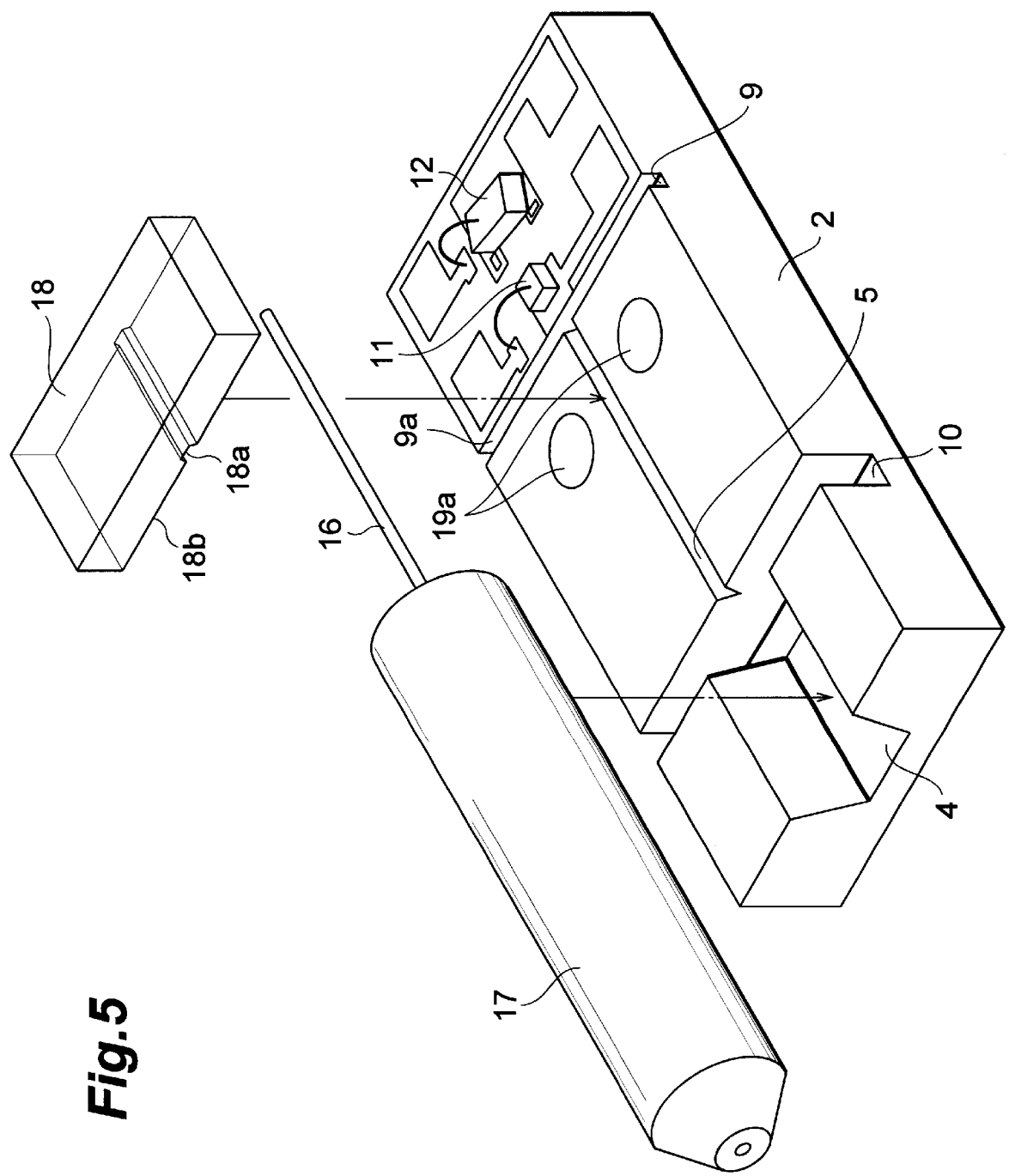
FIG. 5 is a view showing a step of providing the substrate with an optical fiber.

FIG. 5 is a view showing a step of securing an optical fiber 16 to the substrate 2. The optical fiber is placed in the optical fiber support groove 5 of the substrate 2 and then is secured thereto by means of a securing member 18. For this purpose, a UV-curing resin is dropped onto the substrate 2 so as to avoid the optical fiber support groove 5, thereby forming resin members 19a. The optical fiber 16 is disposed in the optical fiber support groove 5 and then is covered with the securing member 18. The securing member 18 has a groove 18a for accommodating the optical fiber 16, and a bonding surface 18b provided so as to face the substrate 2. The optical fiber 16 is supported by three flat faces consisting of the two side faces of the optical fiber support groove 5 and the bottom face of the groove 18a of the securing member 18. The securing member 18 is formed from a material that can transmit ultraviolet light therethrough, e.g., quartz.

FIG. 6A is a view showing a step of securing a ferrule 17. The ferrule 17 is placed in the ferrule support groove 4. UV-curing resin members 19b are also applied to the regions between the side face of the ferrule 17 and the first region 2a of the substrate 2.

Upon irradiation with ultraviolet light, the optical fiber 16 is secured by the securing member 18 and the resin members 19a, whereas the ferrule 17 is secured by the resin members 19b. As a consequence, an optical module principal portion 1 is accomplished.

Since the UV-curing resin is used for securing the ferrule 17 and the substrate 2 to each other, the easier handling of the optical module principal portion is provided after this step. In place of the UV-curing resin, a thermosetting resin can be used as well.

In FIG. 6B, the optical fiber 16 is secured to the optical fiber support groove 5 while coming into contact therewith at two side faces 5a, 5b. In FIG. 6C, the ferrule 17 is secured to the ferrule support groove 4 while coming into contact therewith at two side faces thereof.

Figure 7:
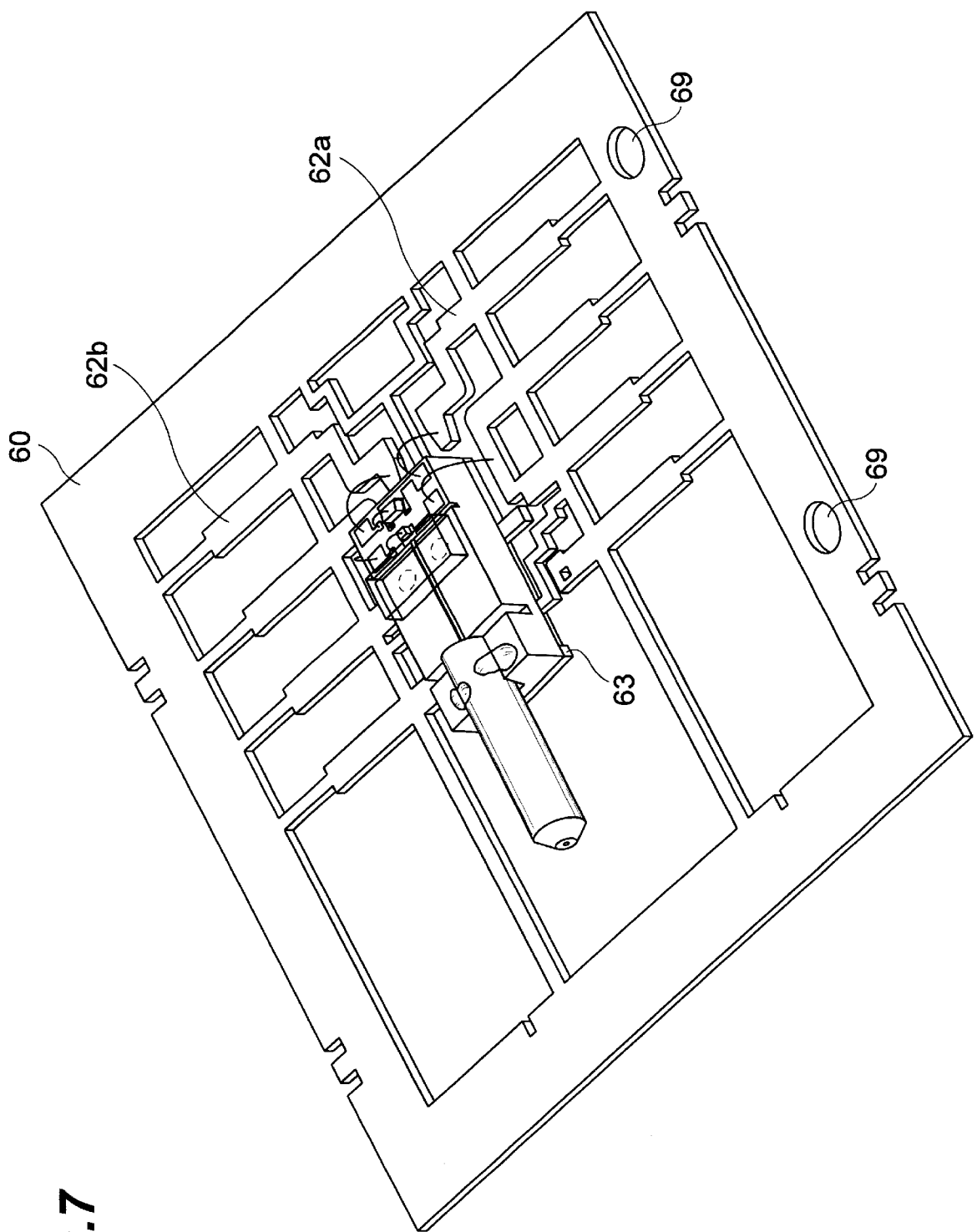
FIG. 7 shows step of assembling the optical module principal portion on a lead frame.

FIG. 7 shows a step of assembling the optical module principal portion 1 on a lead frame 60. The optical module principal portion 1 is bonded to an island portion 63 of the lead frame 60. After the island portion 63 is coated with silver paste, the optical module principal portion 1 is mounted on the island portion 63. For example, the silver paste is heated under such a condition as 180° C. for 20 minutes, so as to be thermally cured. Prior to this bonding, the lead frame 60 and the ferrule 17 are aligned with each other.

Thereafter, the optical module principal portion 1 and the lead frame 60 are wire-bonded.

Figure 8:
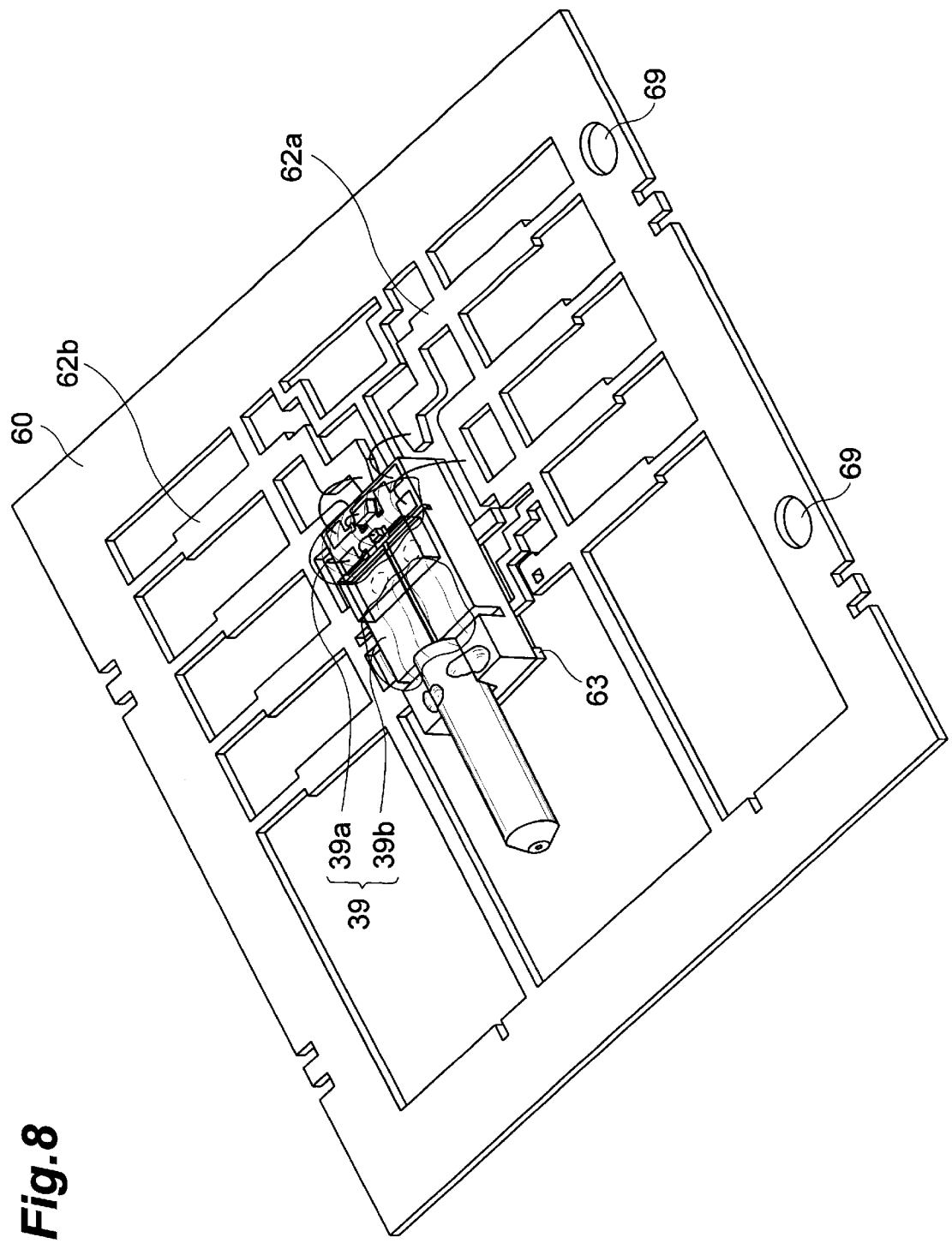
FIG. 8 shows a step of dropping a resin onto the optical module principal portion.

FIG. 8 shows a potting step in which a resin is dropped onto the optical module principal portion 1. It is desirable that the potting is effected at two locations of the optical module principal portion.

One of the locations lies in the region where the LD 11, PD 12, and the end portion of the optical fiber 16 optically coupled to the LD 11 are provided. A potting resin member 39a is transparent to light generated by the LD 11.

The other lies in the region where the optical fiber 16 exposed on the substrate 2 is provided. Covering the optical fiber 16 with a potting resin member 39b can reduce the influence of contraction at the time of the hardening of the molding resin used in transfer molding.

Figure 16:
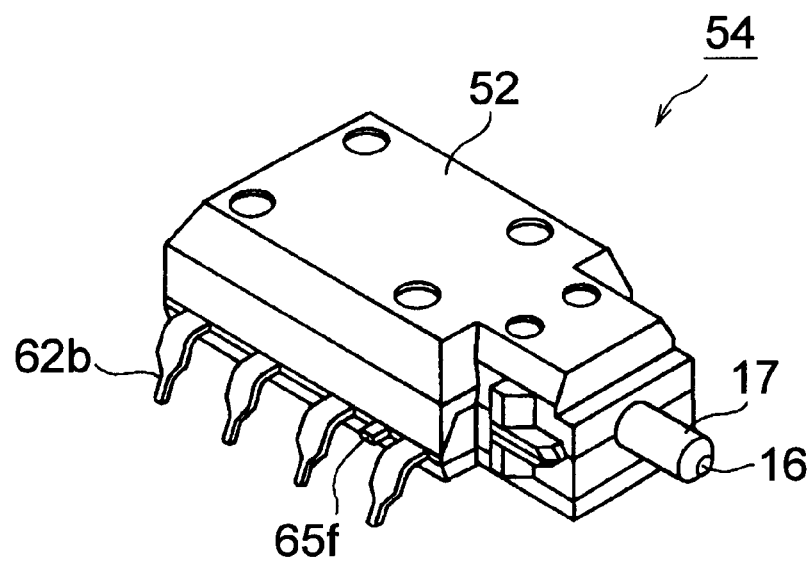
FIG. 16 is a perspective view showing the finished optical module.

Thereafter, after the encapsulation with a resin body 52 in transfer molding and the formation of leads, an optical module 54 as shown in FIG. 16 is accomplished.

Figure 9:
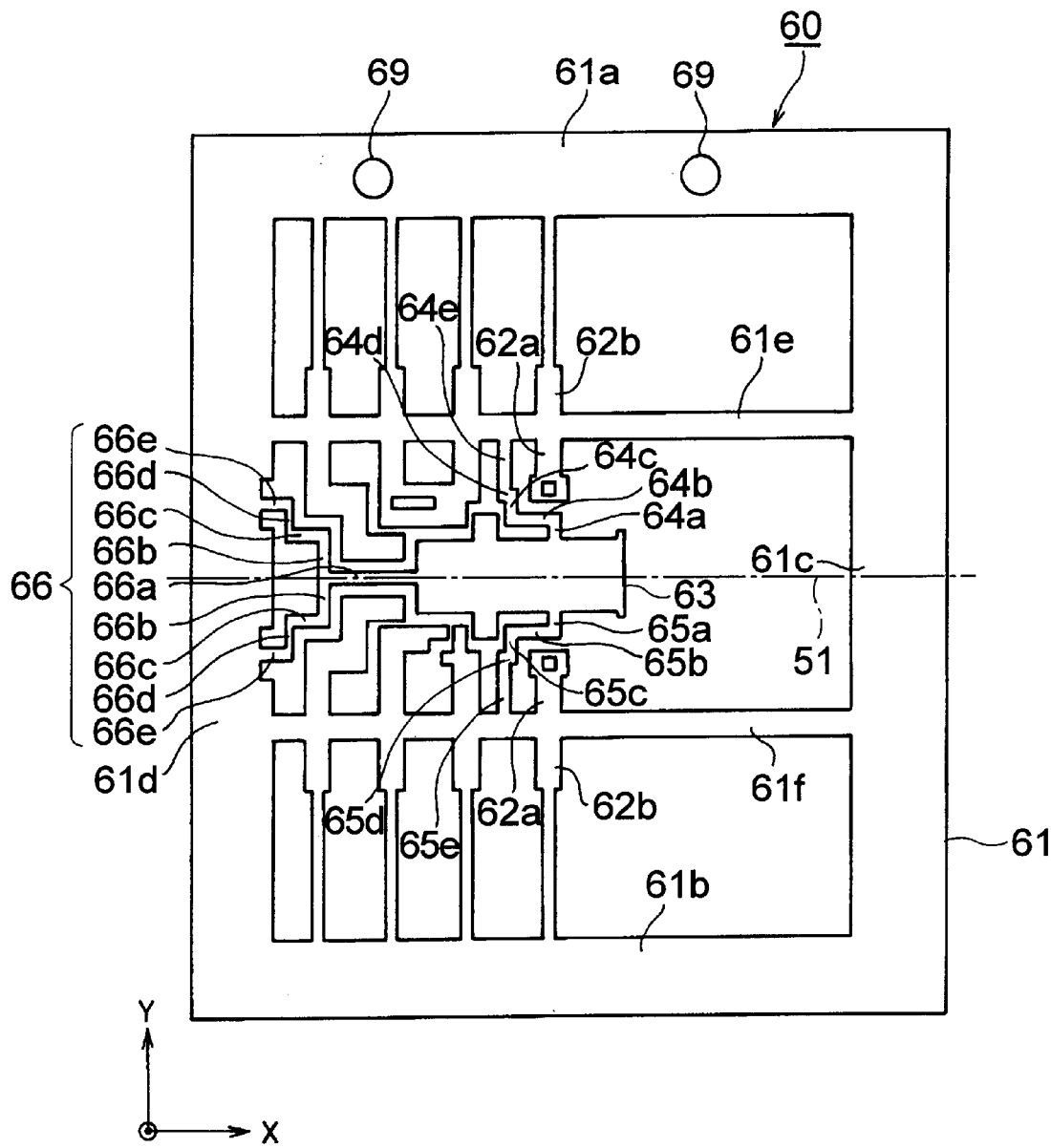
FIG. 9 is a plan view of a lead frame in accordance with the present invention.

Now referring to FIG. 9, the lead frame in accordance with the present invention will be described. FIG. 9 is a plan view of the lead frame 60 on which the optical module principal portion 1 shown in FIG. 6A can be mounted.

The lead frame 60 comprises an outer frame 61, tie bars 61e, 61f, inner leads 62a, outer leads 62b, an island portion 63, and island support portions 64, 65, 66. The outer frame 61 has a top rail 61a, a bottom rail 61b, and side rails 61c, 61d. The outer frame 61 is provided with two positioning holes 69, at their respective locations, available for aligning the lead frame 60 with an encapsulating die. The outer frame 6;1constitutes a frame portion. The frame portion can include the tie bars 61e, 61f. The frame portion can also include the inner leads 62a and outer leads 62b.

The lead frame 60 has a plurality of inner leads 62a. In the lead frame 60 shown in FIG. 9, the inner leads 62a are provided so as to face three sides of the island portion 63. These three side faces are oriented in one direction along the predetermined axis 51 and other directions orthogonal to a predetermined axis 51, respectively. The inner leads 62a are wire-bonded by conductive wires to their corresponding electrodes on the optical module principal portion 1 mounted on the island 63, so as to be electrically connected with the optical module principal portion 1. The inner leads 62a are supported by the tie bars 61e, 61f.

The lead frame 60 has a plurality of outer leads 62b. The plurality of outer leads 62b are disposed so as to correspond to the respective inner leads 62a. In the lead frame 60 shown in FIG. 9, the outer leads 62b extend in directions orthogonal to the predetermined axis 51. The outer leads 62b start from the tie bars 61e, 61f, and then extend in a direction from the tie bars 61e, 61f toward the outer frames 61a, 61b so as to reach the outer frame.

The optical module principal portion 1 is mounted on the island portion 63 such that the end face of the ferrule 17 mounted on the optical module principal portion 1 is oriented in the direction of the predetermined axis 51 (the positive direction of X axis in FIG. 9). The island portion 63 has the island support portions 64 (64a, 64b, 64c, 64d, 64e), 65 (65a, 65b, 65c, 65d, 65e), 66 (66a, 66b, 66c, 66d, 66e) extending from three side faces thereof, respectively.

The island support portions 64, 65, 66 have deformation parts which are disposed such that the position of the island portion 63 can be displaced in directions (e.g., Y directions in FIG. 9) intersecting the predetermined axis 51 within the plane including the island portion 63. The island support portions 64, 65 are disposed at two island sides oriented in directions intersecting the predetermined axis 51. The island support portion 66 is disposed at one of island sides oriented in the directions of the predetermined axis 51. The island support portions 64, 65, 66 reach the outer frame 61d or the tie bars 61e, 61f, so as to support the island portion 63. The deformation parts are elastically deformed or flexed, thereby making the position of the island portion 63 movable in directions orthogonal to the predetermined axis 51 in the plane including the lead frame 60.

Each of the island support portions 64, 65, 66 can comprise bent parts which are bent at two or more positions.

When the bent parts are provided at two positions, the following structure can be realized: the island support portion can comprise a first part extending along the predetermined axis 51, and second and third parts extending in directions intersecting the predetermined axis 51, both ends of the second part being provided with the second and third parts, respectively; the island support portion can comprise fourth and fifth parts extending along the predetermined axis 51, and a sixth part extending in a direction intersecting the predetermined axis 51, both ends of the sixth part being provided with the fourth and fifth parts, respectively.

The X coordinates of the positions at which the island support portions 64, 65 connect with the tie bars 61e, 61f differ from those of the positions at which they connect with the island 63. The Y coordinates of the positions at which the island support portion 66 connects with the outer frame 61a to 61d also differ from the Y coordinate of the position at which the island support portion 66 connects with the island 63. Such positional differences make it easy to provide the island support portions 64, 65, 66 with bent parts without restricting the arrangement of inner leads.

In the example shown in FIG. 9, a first portion 66a and second portions 64b, 65b function as deformation parts. Preferably, the first portion 66a is narrower and longer than the other parts of the island support portion 66. Preferably, the second portions 64b, 65b are narrower and longer than the other parts of the island support portions 64, 65.

The island 63 is supported by the island support portions 64, 65, 66. As a consequence, when the ferrule 17 is placed at the ferrule accommodation portion (42 in FIG. 12) of the encapsulating die so as to be resin-encapsulated, the deformation parts are deformed in response to the misalignment between the ferrule 17 mounted to the optical module principal portion 1 and the ferrule accommodation portion 42. This deformation can absorb the positional deviation between the ferrule 17 and the ferrule accommodation portion (42 in FIG. 12). The inner stress caused by this positional deviation would not remain in the encapsulating resin body.

The lead frame 60 shown in FIG. 9 relates to the case where three sides of the island 63 are provided with the island support portions 64, 65, 66, respectively. The positions at which the island support portions are arranged should not be, however, restricted to the examples shown in FIG. 9. For example, the island support portions can be provided at only two sides of the island portion 63 that are oriented in directions orthogonal to a predetermined axis.

Preferably, the island support portions are made thinner than the island 63. The thinner island support portions can be deformed more easily. A method of thinning the island support portions 64, 65, 66 is as follows: the lead frame 60, covered with an etching mask except for parts to be thinned, is exposed for a predetermined period of time to a solution capable of chemically etching the material of lead frame 60.

Figure 10:
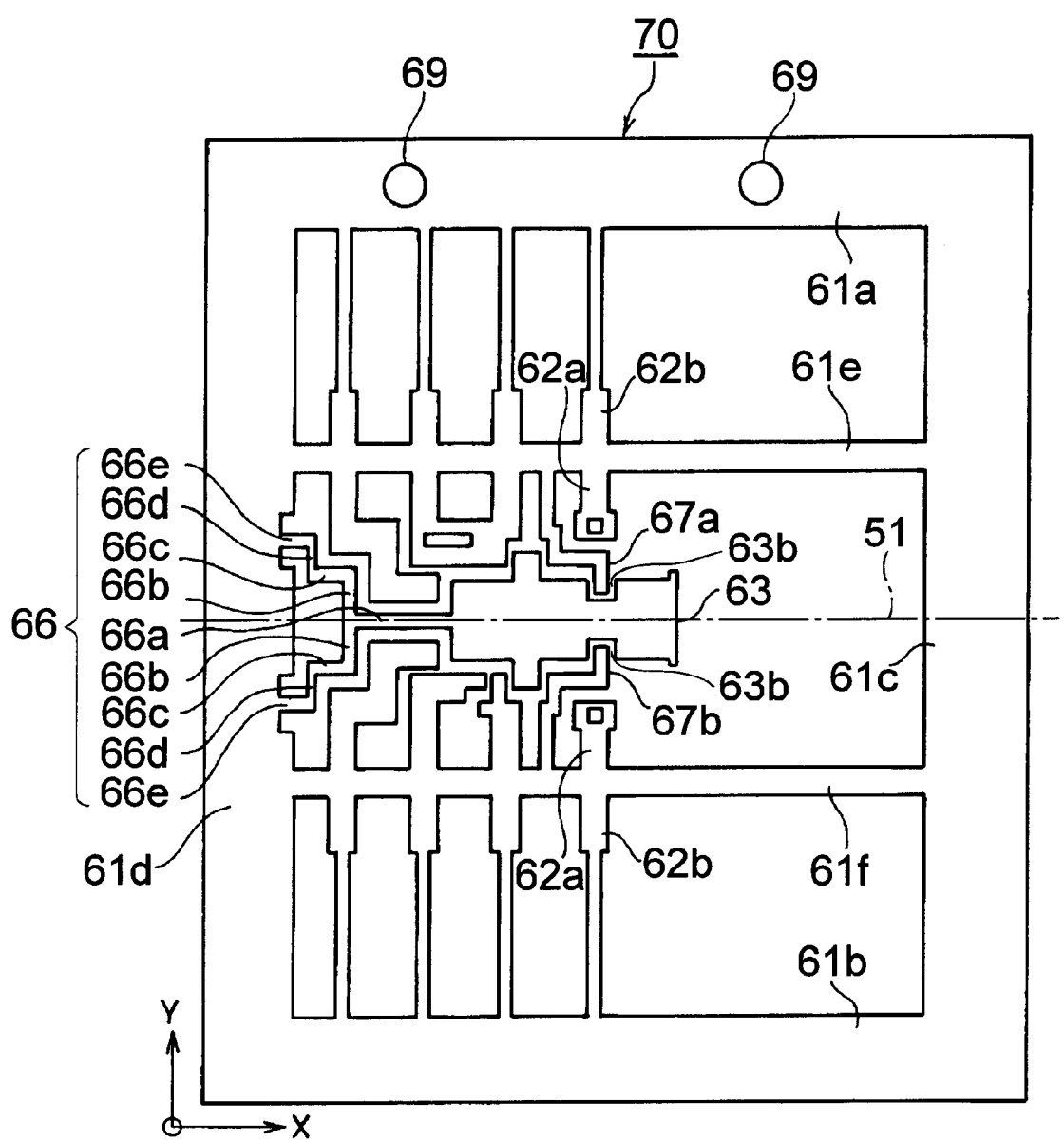
FIG. 10 is a plan view of a lead frame in accordance with another embodiment of the present invention.
Figure 11:
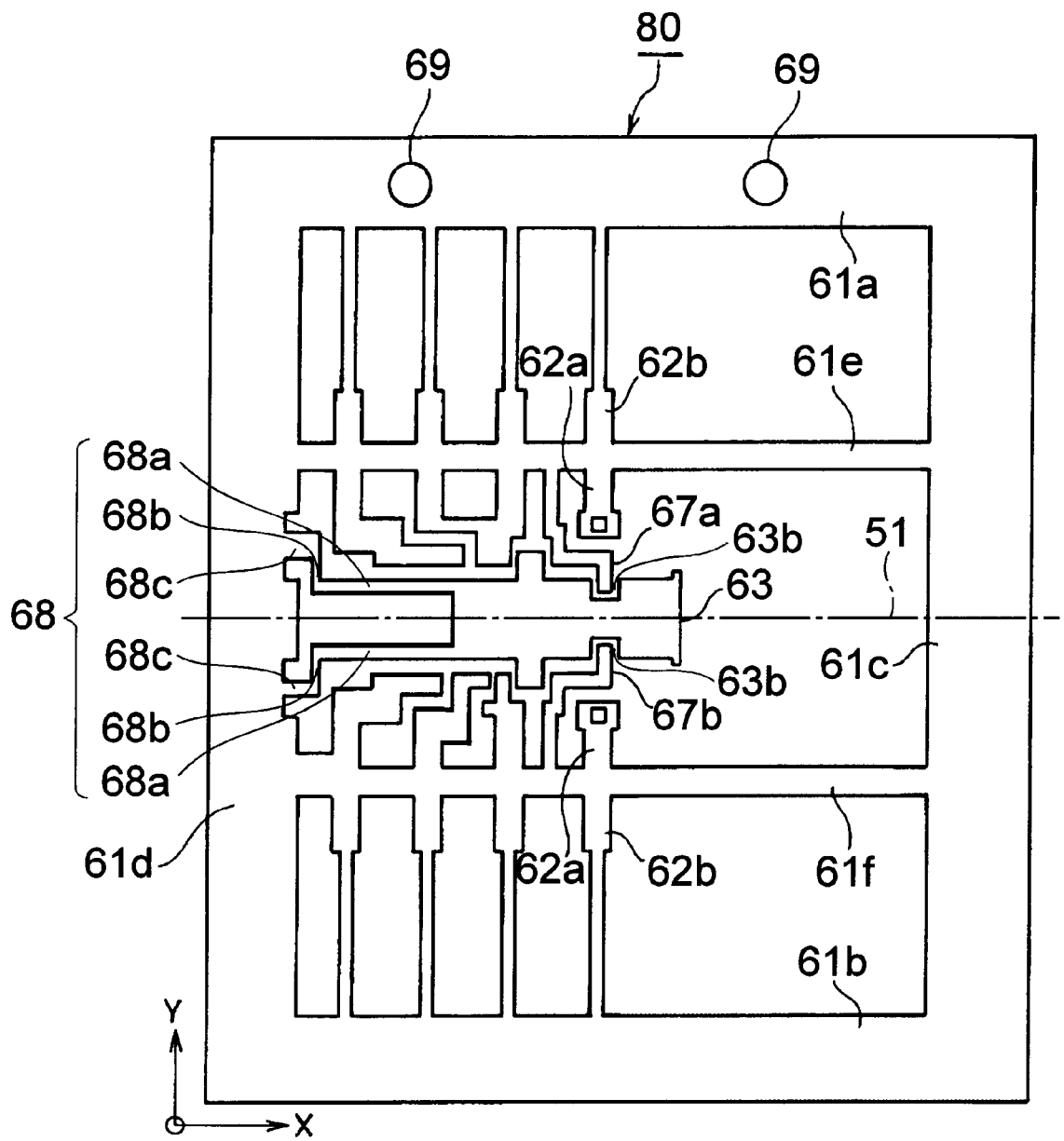
FIG. 11 is a plan view showing a lead frame in accordance with still another embodiment of the present invention.

FIGS. 10 and 11 show other embodiments of the lead frame in accordance with the present invention. In FIGS. 10 and 11, parts having the same functions as those of the lead frame 60 shown in FIG. 9 are referred to with the identical numerals or letters, without repeating their descriptions.

The lead frame 70 shown in FIG. 10 comprises only one island support portion 66. The island support portion 66 has a deformation part provided so as to make the island portion 63 displaceable in directions (Y directions in FIG. 10) orthogonal to the predetermined axis 51. The island support portion 66 is disposed at an island side intersecting the predetermined axis 51 (the positive X direction in FIG. 10).

The lead frame 70 comprises substrate support portions 67a, 67b. The substrate support portions 67a, 67b extend toward the island 63 from the tie bars 61e, 61f, respectively. The substrate support portions 67a, 67b can assist in supporting the optical module principal portion 1 mounted onto the island portion 63. Together with the island support portion 66, the substrate support portions 67a, 67b support the optical module principal portion 1. The island portion 63 comprises a pair of depressions 63b. The front ends of the substrate support portions 67a, 67b are positioned within the depressions 63b of the island 63, respectively.

When the front end parts of the substrate support portions 67a, 67b come into contact with the bottom face of the optical module principal portion 1, the substrate support portions 67a, 67b support the optical module principal portion 1 together with the island portion 63. The substrate support portions 67a, 67b prevent the island support portion 66 supporting the island 63 from flexing due to the load of the optical module principal portion and thereby dislocating the island portion 63 from the plane including the lead frame 70.

FIG. 11 is a plan view showing the lead frame in accordance with another embodiment of the present invention. Referring to FIG. 11, the lead frame 80 comprises a pair of island support portions 68 (68a, 68b, 68c). The pair of island support portions 68 (68a, 68b, 68c) have deformation portions provided so as to make the island 63 movable in directions (Y directions in FIG. 11) orthogonal to the predetermined axis 51. The pair of island support portions 68 are disposed at the opposite ends of one side of the island portion 63, respectively.

The island support portions 68 prevent the dislocation of the island 63 from the plane including the lead frame 80 due to the load of the optical module principal portion 1. FIG. 11 shows the lead frame 80 having the substrate support portions 67a, 67b. The substrate support portions 67a, 67b can be, however, omitted if the island portion 63 can fully be supported by the island support portions 68 attached thereto. When no substrate support portions 67a, 67b are provided, the arrangement of inner leads 62a is restricted thereby.

Figure 12:
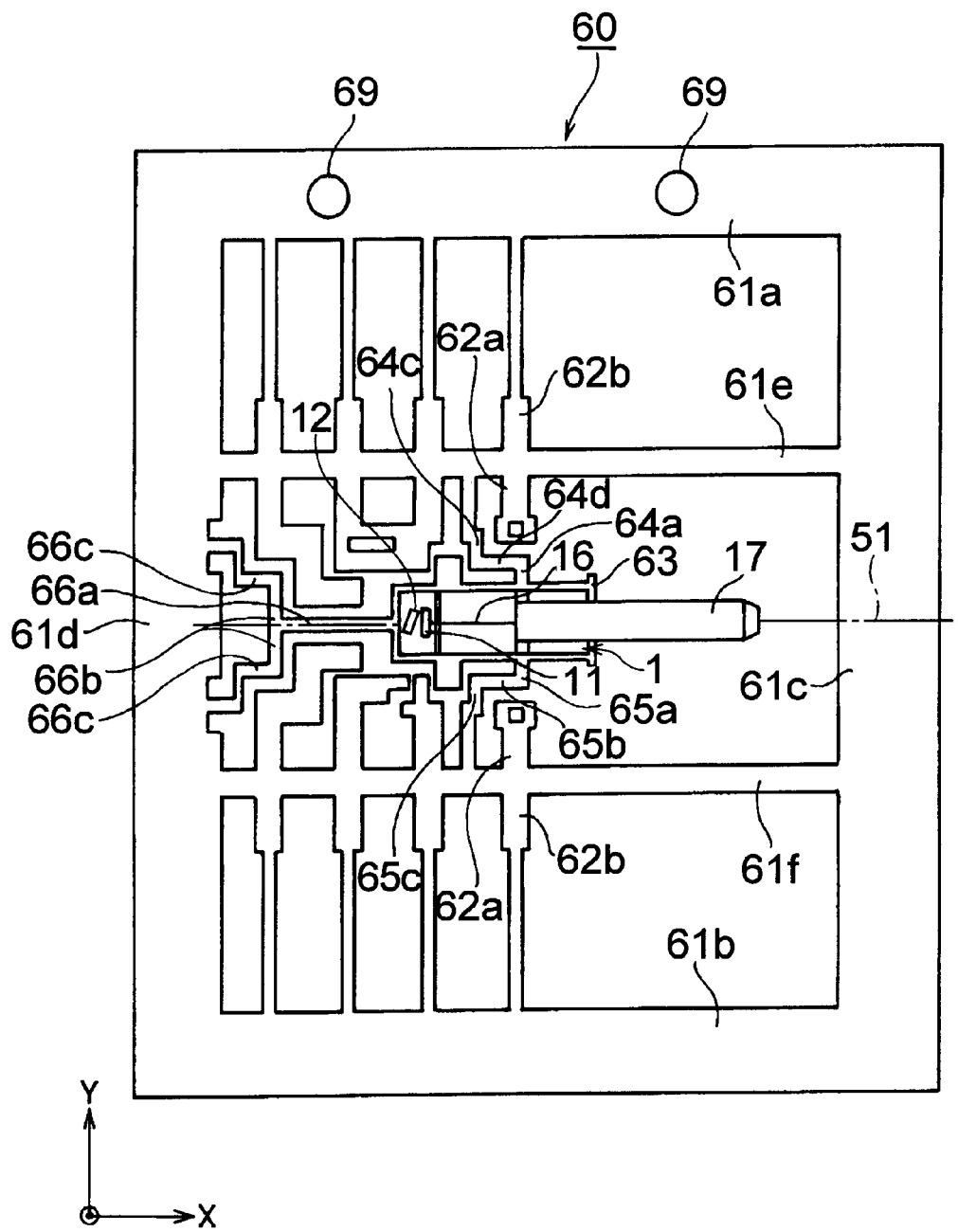
FIG. 12 is a plan view showing the lead frame of FIG. 9 mounted with the optical module principal portion of FIG. 6A.
Figure 13:
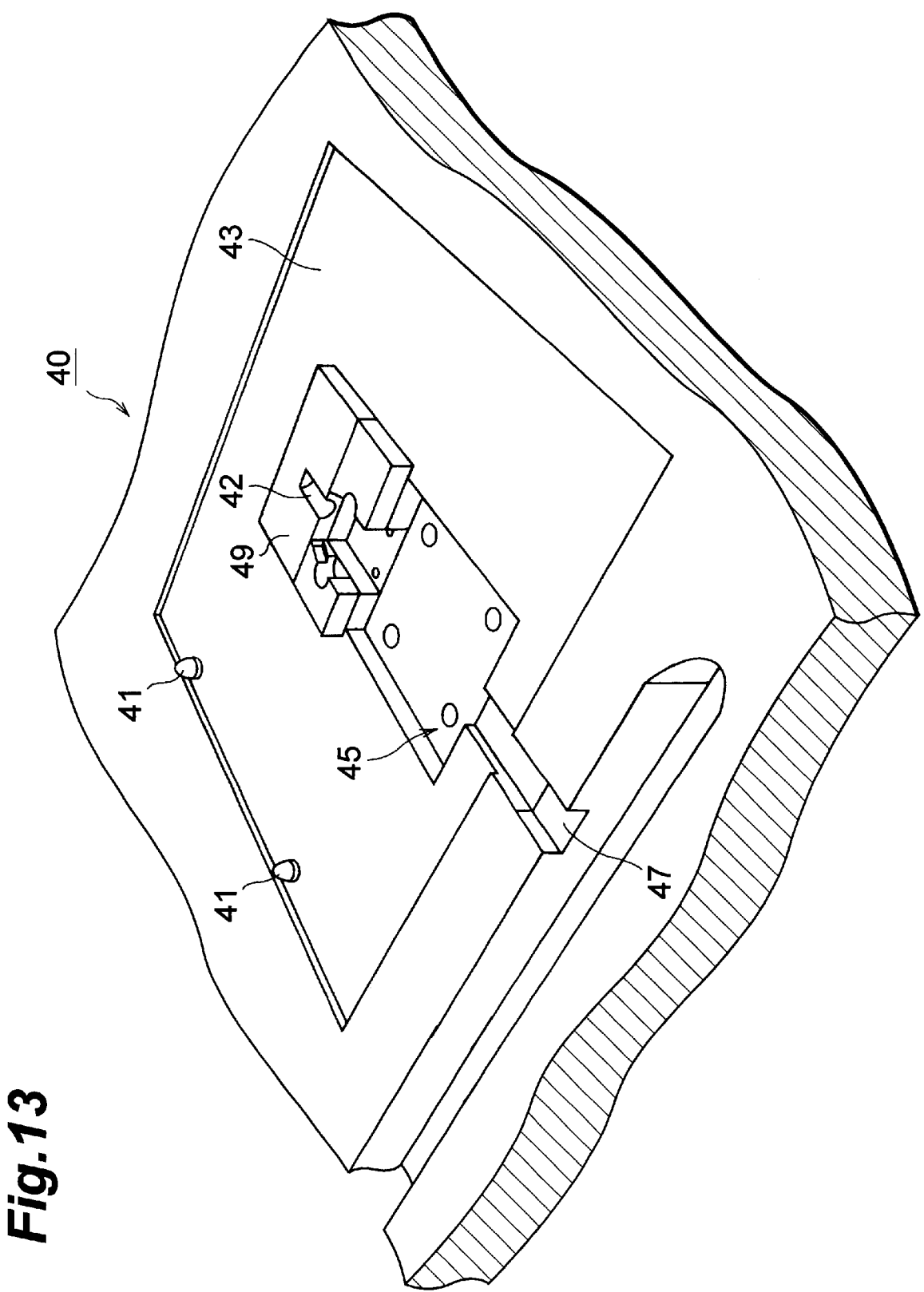
FIG. 13 is a perspective view showing a transfer-molding die.

As described in the foregoing, since the island support portions 64, 65, 66, 68 are provided, the positional deviation between the ferrule 17 mounted on the optical module principal portion 1 and the ferrule accommodation portion of the encapsulating die (42 in FIG. 12) can be absorbed by the island support portions when the ferrule 17 is placed in the ferrule accommodation portion (42 in FIG. 13).

A method of making an optical module using the lead frame in accordance with an embodiment of the present invention will now be explained in detail with reference to FIGS. 12 to 16.

Referring to FIG. 12, the optical module principal portion 1 is mounted on the island portion 63 such that the ferrule 17 aligns with the predetermined axis 51 of the lead frame 60. The optical module principal portion 1 is positioned on the lead frame 60 such that the ferrule 17 is accommodated in the ferrule accommodation portion (42 in FIG. 13) when the lead frame 60 is placed in the encapsulating die. After the mounting location of the optical module principal portion 1 is determined, the optical module principal portion 1 is bonded onto the island portion 63.

Subsequently, the lead frame 60 including the optical module principal portion 1 bonded thereon is placed in the encapsulating die. This placement has already been described with reference to FIGS. 7 and 8.

FIG. 13 is a perspective view of the lower encapsulating die 40. The die 40 comprises pins 41 for aligning with the lead frame 60. On the lead-frame-mounting surface 43 of the die 40, the ferrule accommodation portion 42 and a cavity portion 45 are disposed. The ferrule accommodation portion 42 accommodates the ferrule 17 mounted onto the optical module principal portion 1 when the lead frame 60 is mounted on the surface 43. The cavity portion 45 defines the form of the resin body of the optical module provided under the lead frame surface. The encapsulating resin for resin-molding is introduced into the cavity portion 45 from an injection gate portion 47.

Figure 14:
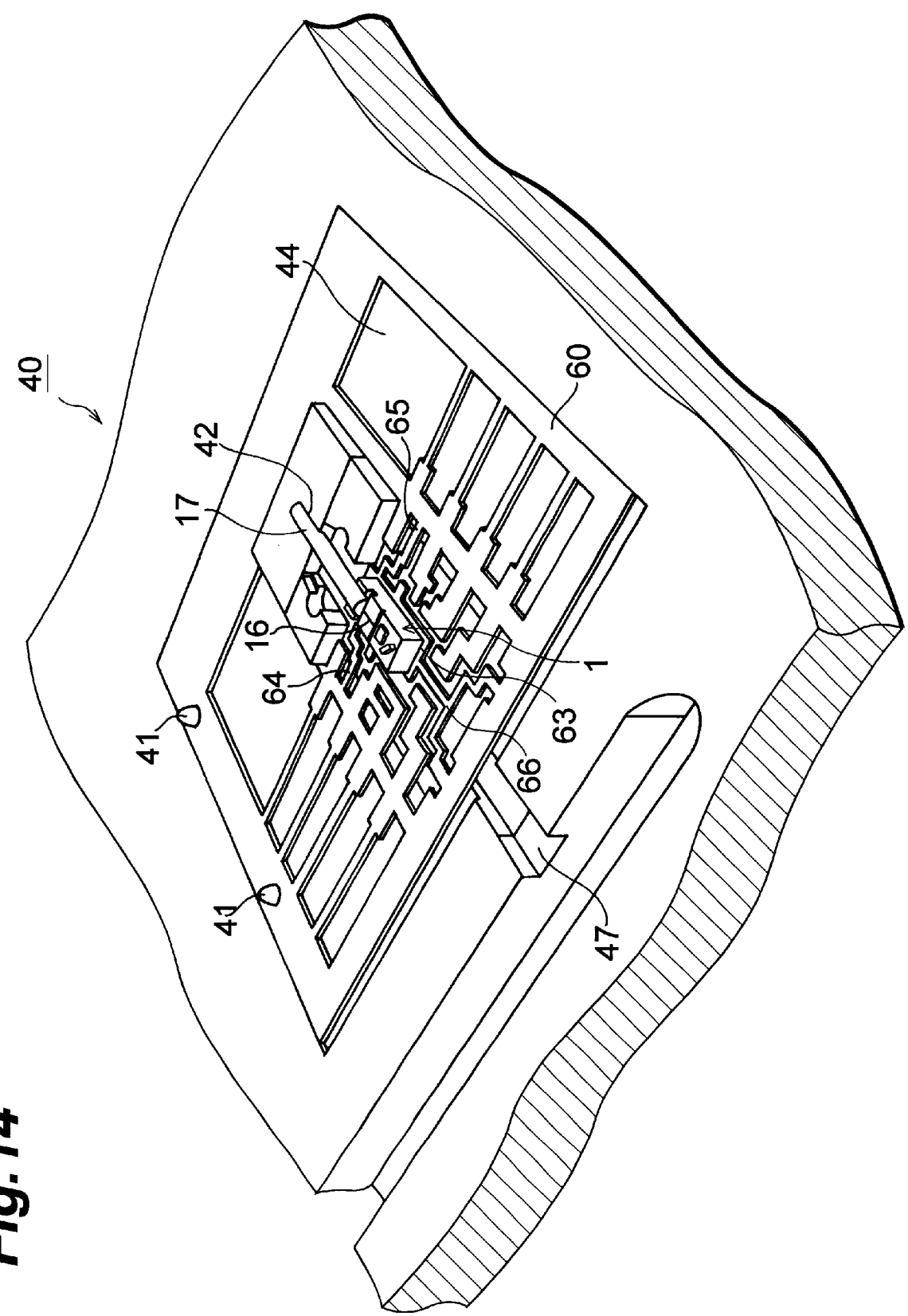
FIG. 14 is a perspective view showing the lead frame of FIG. 12 on which the transfer-molding die of FIG. 13 is provided.

Referring to FIG. 14, the lead frame 60 is mounted on the die 40 such that the positioning pins 41 of the die 40 are inserted into the alignment holes 69. Simultaneously with this positioning, the ferrule 17 is accommodated in the ferrule accommodation portion 42. Even if the optical module principal portion 1 is slightly dislocated in the rightward or leftward direction of the ferrule 17 with respect to the lead frame 60, such dislocation can be absorbed by the island support portions 64, 65, 66. As a consequence, providing the island support portions 64, 65, 66 can reduce the force applied to the ferrule 17 even when it is accommodated in the ferrule accommodation portion 42 of the die 40.

After the lead frame 60 and the optical module principal portion 1 are mounted on the lower die 40, the upper die (not depicted) is assembled thereto. The encapsulating resin is injected from the injection gate 47 and cured, whereby a resin body is formed.

Figure 15:
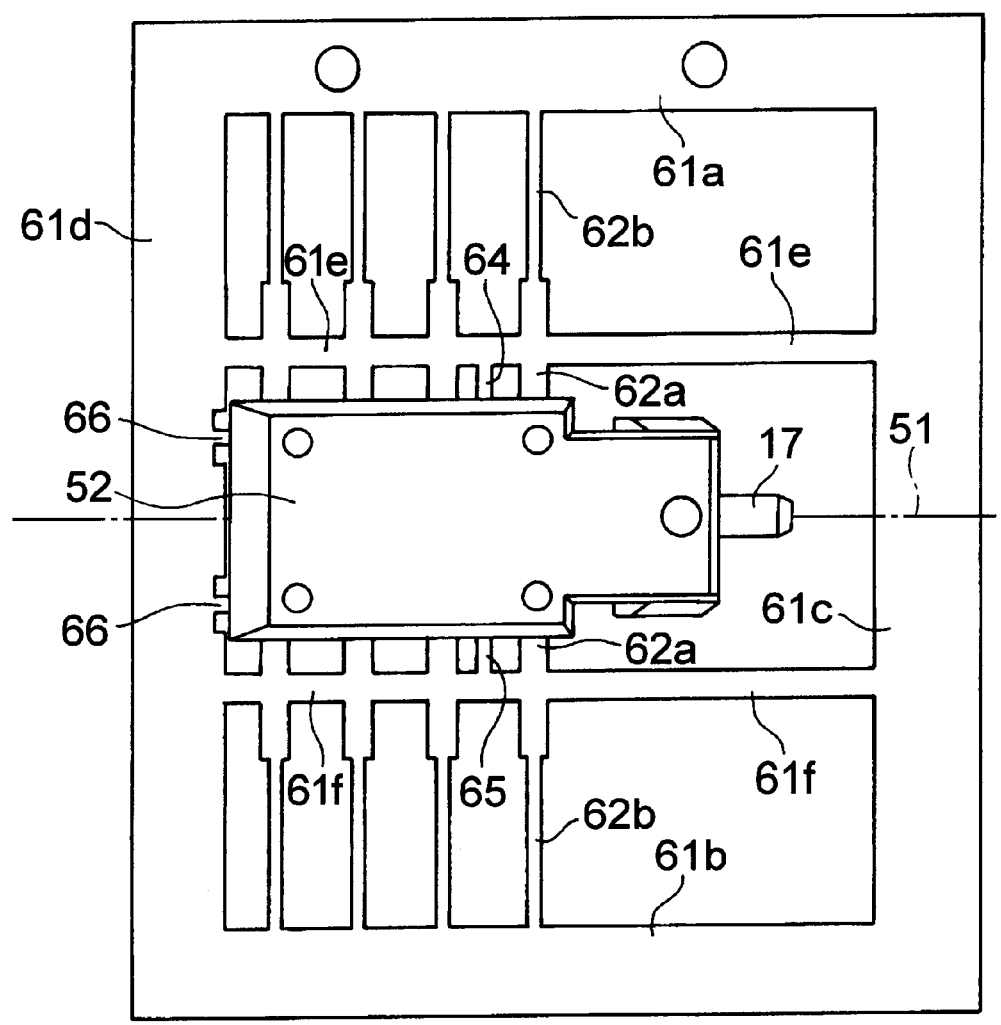
FIG. 15 is a plan view showing the lead frame encapsulated With a molding resin.

FIG. 15 is a plan view showing the resin body 52 and the lead frame 60. The inner leads 62a extend in directions orthogonal to the predetermined axis 51 and are encapsulated within the encapsulating resin body 52. The island support portions 64, 65 extend from the tie bars 61e, 61f, respectively so as to be contained within the encapsulating resin 52. The island support portions 66 extend from the outer frame 61d of the lead frame so as to be encapsulated within the encapsulating resin 52.

After the resin molding, the tie bars 61e, 61f, the island support portions 64, 65, 66, and the outer leads 62b are cut at predetermined positions, and the outer leads 62b are shaped.

FIG. 16 shows the finished optical module 54. Referring to FIG. 16, the shaped outer leads 62b and the cut end 65f of the island support portion 65 are shown. In the optical module 54 shown in FIG. 16, since the tie bars 61e, 61f are cut, the outer leads 62b are electrically isolated from each other and from the island support portions 64, 65, 66. Providing the island support portions 64, 65, 66 would not affect the electric characteristics of the finished optical module 54.

An optical module principal portion 56 in accordance with another embodiment of the present invention will now be explained with reference to FIG. 17. The optical module principal portion 56 corresponds to the optical module principal portion 1 shown in FIG. 6A. The lead frame, optical module, and method of making the optical module in accordance with the present invention are also applicable to the optical module principal portion 56 as described hereinafter.

Figure 17:
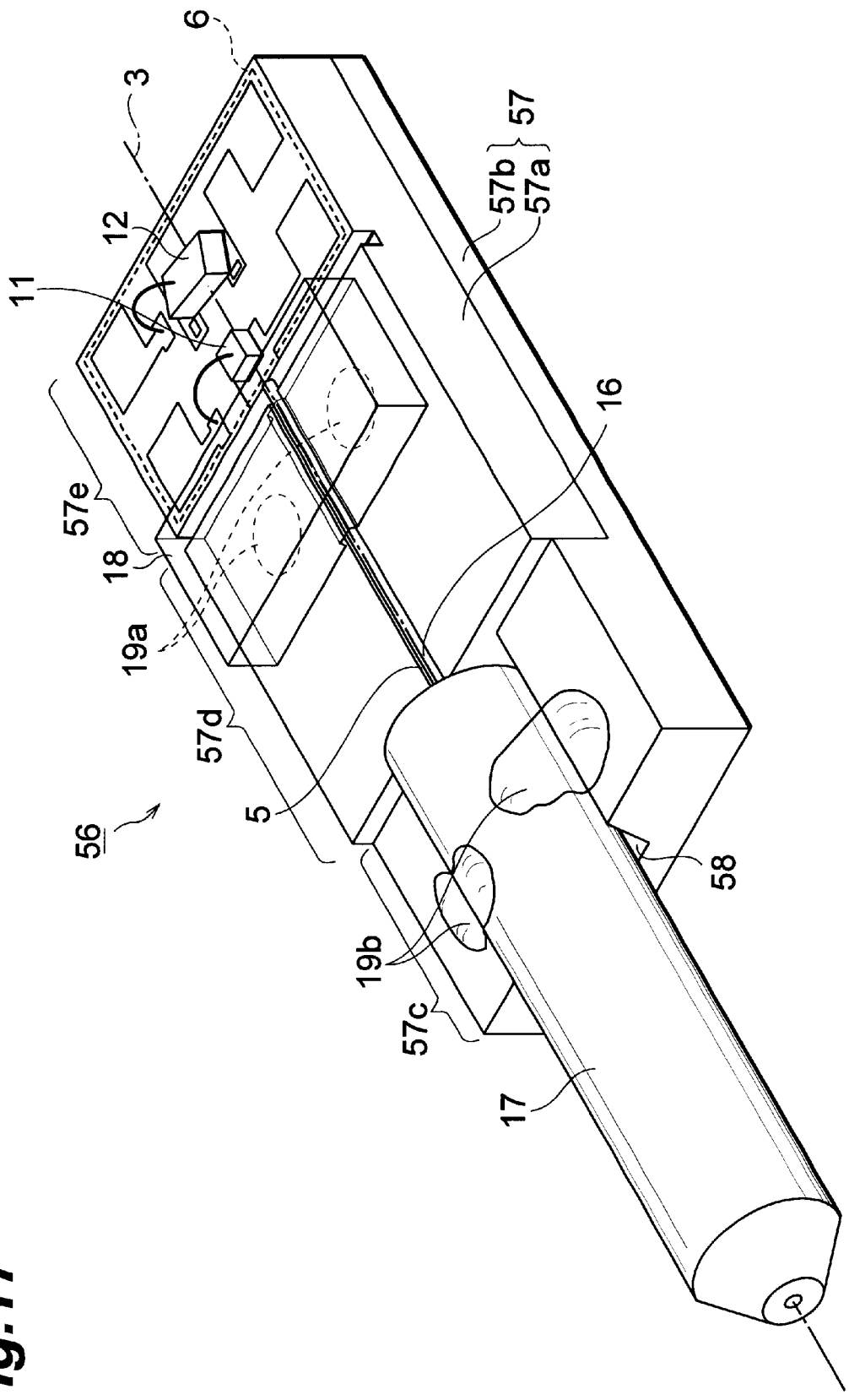
FIG. 17 is a perspective view of another optical module principal portion to which the lead frame of the present invention is applicable.

Referring to FIG. 17, the substrate 57 comprises a base 57a and a platform 57b. The platform 57b is mounted on the base 57a. The base 57a has a first region 57c thereon. The platform 57b has a second region 57d and a third region 57e along a predetermined axis 3. The first region 57c is provided with a ferrule support groove 58 for supporting a ferrule. The second region 57d is provided with an optical fiber support groove 5 for supporting an optical fiber.

The optical fiber support groove 5 and the ferrule support groove 58 are centered at the predetermined axis 3. Since the substrate 57 is similar to the substrate 2 of FIG. 3 except for these points mentioned above, further detailed explanation will be omitted.

In the lead frame in accordance with the present invention, as explained in detail in the foregoing, the island support portion allows the position of the island, provided for mounting the optical module principal portion, to be displaced in a direction intersecting the ferrule axis. When the lead frame is placed in the encapsulating die so as to be resin-encapsulated, the stress caused by the positional deviation can be absorbed by the island support portion. Applying these lead frames to optical modules provides the optical modules in which the inner stress of the resin body is decreased.

What is claimed is:

1. A lead frame for mounting an optical module principal portion; said optical module principal portion including a semiconductor optical device, an optical fiber optically coupled to said semiconductor optical device, and a ferrule in which said optical fiber is inserted; said lead frame comprising:

a frame portion;

an island portion provided so as to mount said optical module principal portion such that said ferrule is aligned with a predetermined axis;

first island support portion, bent at a plurality of positions, connecting said island portion of said frame portion; and a second island support portion, bent at a plurality of positions, connecting said island portion to said frame portion;

wherein said first island support portion extends directly from said island portion in a direction intersecting said predetermined axis, and wherein said second island support portion extends directly from said island portion in a direction of said predetermined axis.

2. The lead frame according to claim 1, wherein said first island support portion has a first part extending directly from said island portion in a direction intersecting said predetermined axis, a second part extending from said first part in a direction of said predetermined axis, and a third part extending from said second part in a direction intersecting said predetermined axis; and wherein said second island support portion has a fourth part extending directly from said island portion in a direction of said predetermined axis, a fifth part extending from said fourth part in a direction intersecting said predetermined axis, and a sixth part extending from said fifth part in a direction of said predetermined axis.

3. The method of fabricating an optical module in which an optical module principal portion including an optical fiber, a ferrule in which said optical fiber is inserted, and a semiconductor optical device provided so as to be optically coupled to said optical fiber is encapsulated with an encapsulating resin; said method comprising the steps of;

mounting said optical module principal portion on the lead frame according to claim 2, placing said lead frame mounted with said optical module principal portion on an encapsulating die such that said ferrule is provided in a ferrule accommodation portion of said encapsulating die; and resin-encapsulating said lead frame and said optical module principal portion using said encapsulating die.

4. An optical module fabricated by the method according to claim 3.

5. The lead frame according to claim 1, further comprising a third island support portion, bent at a plurality of positions, connecting said island portion to said frame portion, wherein said third island support portion extends directly from said island portion in a direction intersecting said predetermined axis.

6. The lead frame according to claim 5, wherein said third island support portion has a seventh part extending directly from said island portion in a direction intersection said predetermined axis, an eighth part extending from said seventh part in a direction of said predetermined axis, and a ninth part extending from said eighth part in a direction intersection said predetermined axis.

7. The method of fabricating an optical module in which an optical module principal portion including an optical fiber, a ferrule in which said optical fiber is inserted, and a semiconductor optical device provided so as to be optically coupled to said optical fiber is encapsulated with an encapsulating resin; said method comprising the steps of;

mounting said optical module principal portion on the lead frame according to claim 6, placing said lead frame mounted with said optical module principal portion on an encapsulating die such that said ferrule is provided in a ferrule accommodation portion of said encapsulating die; and resin-encapsulating said lead frame and said optical module principal portion using said encapsulating die.

8. An optical module fabricated by the method according to claim 7.

9. The lead frame according to claim 5, wherein said island portion has a pair of sides, each extending in a direction of the predetermined axis, wherein said first island support portion extends directly from one of the pair of sides; and wherein said third island support portion extends directly from the other of the pair of sides.

10. A method of fabricating an optical module in which an optical module principal portion including an optical fiber, a ferrule in which said optical fiber is inserted, and a semiconductor optical device provided so as to be optically coupled to said optical fiber is encapsulated with an encapsulating resin; said method comprising the steps of:

mounting said optical module principal portion on the lead frame according to claim 9;

placing said lead frame mounted with said optical module principal portion on an encapsulating die such that said ferrule is provided in a ferrule accommodation portion of said encapsulating die; and resin-encapsulating said lead frame and said optical module principal portion using said encapsulating die.

11. An optical module fabricated by the method according to claim 10.

12. The method of fabricating an optical module in which an optical module principal portion including an optical fiber, a ferrule in which said optical fiber is inserted, and a semiconductor optical device provided so as to be optically coupled to said optical fiber is encapsulated with an encapsulating resin; said method comprising the steps of:

mounting said optical module principal portion on the lead frame according to claim 5;

placing said lead frame mounted with said optical module principal portion on an encapsulating die such that said ferrule is provided in a ferrule accommodation portion of said encapsulating die; and resin-encapsulating said lead frame and said optical module principal portion using said encapsulating die.

13. An optical module fabricated by the method according to claim 12.

14. The method of fabricating an optical module in which an optical module principal portion including an optical fiber, a ferrule in which said optical fiber is inserted, and a semiconductor optical device provided so as to be optically coupled to said optical fiber is encapsulated with an encapsulating resin; said method comprising the steps of:

mounting said optical module principal portion on the frame according to claim 1;

placing said lead frame mounted with said optical module principal portion on an encapsulating die such that said ferrule is provided in a ferrule accommodation portion of said encapsulating die; and resin-encapsulating said lead frame and said optical module principal portion using said encapsulating die.

15. An optical module fabricated by the method according to claim 14.

16. The lead frame according to claim 1, wherein said first island support portion has a part less thick than said island portion.

17. The method of fabricating an optical module in which an optical module principal portion including an optical fiber, a ferrule in which said optical fiber is inserted, and a semiconductor optical device provided so as to be optically coupled to said optical fiber is encapsulated with an encapsulating resin; said method comprising the steps of:

mounting said optical module principal portion on the lead frame according to claim 16, placing said lead frame mounted with said optical module principal portion on an encapsulating die such that said ferrule is provided in a ferrule accommodation portion of said encapsulating die; and resin-encapsulating said lead frame and said optical module principal portion using said encapsulating die.

18. An optical module fabricated by the method according to claim 17.

* * * * *